(12) United States Patent
Uchikoba et al.

(10) Patent No.: US 10,617,006 B2
(45) Date of Patent: Apr. 7, 2020

(54) SMALL ELECTRONIC COMPONENT, ELECTRONIC CIRCUIT BOARD, AND METHOD OF MANUFACTURING SMALL ELECTRONIC COMPONENT

(71) Applicant: SUMIDA CORPORATION, Chuo-Ku, Tokyo (JP)

(72) Inventors: Fumio Uchikoba, Tokyo (JP); Tsutomu Otsuka, Natori (JP); Mitsugu Kawarai, Natori (JP); Motomi Takahashi, Natori (JP)

(73) Assignee: SUMIDA CORPORATION, Tokyo (JP)

( * ) Notice: Subject to any disclaimer, the term of this patent is extended or adjusted under 35 U.S.C. 154(b) by 441 days.

(21) Appl. No.: 15/208,906

(22) Filed: Jul. 13, 2016

(65) Prior Publication Data
US 2017/0034915 A1   Feb. 2, 2017

(30) Foreign Application Priority Data

Jul. 29, 2015  (CN) .......................... 2015 1 0456966

(51) Int. Cl.
*H01F 27/02*  (2006.01)
*H01F 1/00*  (2006.01)
(Continued)

(52) U.S. Cl.
CPC ............... *H05K 1/181* (2013.01); *H01F 1/26* (2013.01); *H01F 27/02* (2013.01); *H01F 27/022* (2013.01);
(Continued)

(58) Field of Classification Search
CPC ....... H01F 41/0206; H01L 2924/01015; H01L 2924/19042
(Continued)

(56) References Cited

U.S. PATENT DOCUMENTS 3,125,529 A   3/1964 Simmons et al.
4,298,489 A   11/1981 Ohba et al.
(Continued)

FOREIGN PATENT DOCUMENTS

CN   104051129 A    9/2014
EP    2779182 A2    9/2014
JP   2008288332 A   11/2008

OTHER PUBLICATIONS

Extended European Search Report corresponding to application No. 16181744.0-1556; dated Nov. 30, 2016.

*Primary Examiner* — Alexander Talpalatski
*Assistant Examiner* — Joselito Baisa
(74) *Attorney, Agent, or Firm* — Cantor Colburn LLP

(57) ABSTRACT

Provided are a small electronic component including: a magnetic core including at least a columnar core part; a winding coil arranged so as to surround an outer peripheral surface side of the columnar core part and formed by winding a winding wire; and a magnetic cover part formed so as to cover at least part of the magnetic core and the winding coil while following at least part of shapes of the magnetic core and the winding coil through use of a magnetic material containing a mixture of a phosphoric acid ester-based surfactant, magnetic powder, and a resin, an electronic circuit board using the small electronic component, and a method of manufacturing a small electronic component.

11 Claims, 7 Drawing Sheets

(51) Int. Cl.
*H05K 1/18* (2006.01)
*H01F 1/26* (2006.01)
*H01F 27/255* (2006.01)
*H01F 27/30* (2006.01)
*H01F 41/02* (2006.01)
*H01F 27/24* (2006.01)
*H01F 27/28* (2006.01)

(52) U.S. Cl.
CPC ............ *H01F 27/24* (2013.01); *H01F 27/255* (2013.01); *H01F 27/28* (2013.01); *H01F 27/30* (2013.01); *H01F 41/0206* (2013.01); *H01F 41/0246* (2013.01); *H05K 2201/1003* (2013.01)

(58) Field of Classification Search
USPC .......................................... 336/83; 428/692.1
See application file for complete search history.

(56) References Cited

U.S. PATENT DOCUMENTS

| | | | | |
|---|---|---|---|---|
| 5,429,899 A * | 7/1995 | Chiba | ................. | G03G 9/0839 428/403 |
| 6,373,368 B1 * | 4/2002 | Shikama | ................. | H01F 41/04 29/605 |
| 6,487,774 B1 * | 12/2002 | Nakao | ................. | H01B 1/16 252/62.51 R |
| 6,725,525 B1 * | 4/2004 | Shikama | ............. | H01F 17/0013 205/205 |
| 6,903,641 B2 * | 6/2005 | Kondo | ................. | B22F 1/0059 29/602.1 |
| 6,994,797 B2 * | 2/2006 | Oda | .................... | C01G 49/009 252/62.57 |
| 7,495,538 B2 * | 2/2009 | Tsunemi | ................. | H01F 3/10 336/84 M |
| 8,445,105 B2 * | 5/2013 | Mitani | ................. | B22F 1/0007 428/405 |
| 8,518,190 B2 * | 8/2013 | Liao | ......................... | B22F 5/00 148/304 |
| 8,986,568 B2 * | 3/2015 | Morita | .................... | B22F 3/225 252/62.56 |
| 9,754,719 B2 * | 9/2017 | Ohshima | ................. | H02K 1/276 |
| 2005/0003199 A1 | 1/2005 | Takaya et al. | | |
| 2007/0148437 A1 * | 6/2007 | Muller-Schulte | .... | A61K 9/0009 428/327 |
| 2007/0227624 A1 | 10/2007 | Hattori | | |
| 2008/0152897 A1 * | 6/2008 | Maeda | .................. | B22F 1/0059 428/323 |
| 2009/0226751 A1 * | 9/2009 | Mitani | ................. | B22F 1/0007 428/552 |
| 2010/0051851 A1 * | 3/2010 | Mitani | ................. | B22F 1/0007 252/62.54 |
| 2011/0005064 A1 * | 1/2011 | Klesyk | .................. | H01F 27/027 29/605 |
| 2011/0227690 A1 * | 9/2011 | Watanabe | ............... | C22C 38/00 336/221 |
| 2012/0038532 A1 * | 2/2012 | Yonetsu | ................. | B22F 1/0062 343/787 |
| 2012/0249375 A1 * | 10/2012 | Heino | ....................... | C08J 3/24 343/700 MS |
| 2013/0056674 A1 * | 3/2013 | Inagaki | .................. | B22F 1/007 252/62.55 |
| 2013/0106548 A1 * | 5/2013 | Hsieh | .................... | H01F 17/045 336/90 |
| 2014/0085039 A1 * | 3/2014 | Ye | ............................. | B22F 1/02 336/233 |
| 2014/0141220 A1 * | 5/2014 | Yamamoto | ........... | H05K 9/0088 428/215 |
| 2014/0259640 A1 | 9/2014 | Sakamoto et al. | | |
| 2014/0266541 A1 | 9/2014 | Sakamoto et al. | | |
| 2016/0293309 A1 * | 10/2016 | Inagaki | ..................... | H01F 3/08 |

* cited by examiner

SMALL ELECTRONIC COMPONENT, ELECTRONIC CIRCUIT BOARD, AND METHOD OF MANUFACTURING SMALL ELECTRONIC COMPONENT

CROSS-REFERENCE TO RELATED APPLICATIONS

The present application claims priority from Chinese Patent Application No. 201510456966.0 filed on Jul. 29, 2015, the entirety of which is hereby incorporated by reference into this application.

BACKGROUND OF THE INVENTION

1. Field of the Invention

The present invention relates to a small electronic component, an electronic circuit board, and a method of manufacturing a small electronic component.

2. Description of the Related Art

Various electronic components including a magnetic core and a winding coil have been proposed. As one type of such electronic components, there has also been proposed an electronic component further including, in addition to the magnetic core and the winding coil, a magnetic cover part configured to cover the magnetic core and the winding coil (Chinese Patent Application Publication No. 104051129, etc.). The magnetic cover part is formed by molding through use of a magnetic material formed of magnetic powder and a resin.

Meanwhile, the electronic component as disclosed in Chinese Patent Application Publication No. 104051129 is often used as an electronic component to be mounted on a wiring board, and an electronic circuit board including the electronic component is widely used in application to vehicle installation, application to small electronic equipment, such as a mobile phone and a smartphone, and other consumer applications. Therefore, the electronic component for surface mounting to be mounted on a wiring board is required to have at least one kind of characteristics selected from at least characteristics (1) to (7) listed below, in accordance with a manufacturing process of an electronic circuit board including the electronic component, intended use and application thereof, and a size and a mounting density thereof. The electronic component may be required to have a plurality of kinds of the characteristics or may be required to have all kinds of the characteristics simultaneously.

(1) Magnetic powder is less liable to escape from the surface of a magnetic cover part (magnetic powder escape prevention ability).

(2) The bonding between a wiring board and an external electrode of the electronic component is excellent (external electrode bonding property).

(3) The degradation and trouble of the electronic component caused by insulation breakdown due to static electricity can be suppressed (withstand voltage characteristics)

(4) The occurrence of rust under a high-temperature and high-humidity environment can be prevented (antirust ability).

(5) The magnetic characteristics of the magnetic cover part are not significantly changed by heating at a time of surface mounting (heat resistance).

(6) The magnetic cover part after being thermally cured is excellent in mechanical strength (strength after heat curing).

(7) Further, the electronic component used in application to surface mounting is required to have a small size and have a complicated structure and shape in some cases in order to be adaptable to an increase in mounting density and downsizing of the electronic circuit board. In such case, in manufacturing of the electronic component, that is, molding, a filling failure of a magnetic material is liable to occur. Thus, in manufacturing of the electronic component, it is also desired that molding be easy (moldability).

Meanwhile, the electronic component for surface mounting is a general-purpose component and is widely used in various intended uses and applications, e.g., application to installation in vehicles such as an automobile and a railroad vehicle, application to mobile terminals such as a smartphone, a tablet terminal, and a mobile phone, application to wearable terminals such as a wristwatch-type terminal and an eyeglass-type terminal, application to personal computers such as a desktop personal computer and a notebook personal computer, application to audio-video equipment such as a liquid crystal display, an organic EL display, and audio equipment, and application to a digital camera. Therefore, it is important that the electronic component for surface mounting satisfy the characteristics that are highly demanded on the market, that is, all the characteristics (1) to (7) described above so as to widely meet various needs of users irrespective of whether the characteristics are actually required by individual users that use the electronic component.

SUMMARY OF THE INVENTION

The present invention has been made in view of the above-mentioned circumstances, and it is an object of the present invention to provide a small electronic component that is excellent in magnetic powder escape prevention ability, external electrode bonding property, withstand voltage characteristics, antirust ability, heat resistance, strength after heat curing, and moldability, an electronic circuit board using the small electronic component, and a method of manufacturing the small electronic component.

The above-mentioned object is achieved by the following embodiments of the present invention.

According to one embodiment of the present invention, there is provided a small electronic component, including: a magnetic core including at least a columnar core part; a winding coil arranged so as to surround an outer peripheral surface side of the columnar core part and formed by winding a winding wire; and a magnetic cover part formed so as to cover at least part of the magnetic core and the winding coil while following at least part of shapes of the magnetic core and the winding coil through use of a magnetic material containing a mixture of a phosphoric acid ester-based surfactant, magnetic powder, and a resin.

In a small electronic component according to one embodiment of the present invention, it is preferred that the magnetic cover part have a minimum thickness of 0.8 mm or less.

In a small electronic component according to another embodiment of the present invention, it is preferred that the magnetic cover part have a minimum thickness of 0.5 mm or less.

In a small electronic component according to another embodiment of the present invention, it is preferred that a surface of the magnetic cover part have a surface roughness Ra of 6.3 µm or less.

In a small electronic component according to another embodiment of the present invention, it is preferred that a surface of the magnetic cover part have a surface roughness Ra of 1.6 µm or less.

In a small electronic component according to another embodiment of the present invention, the magnetic cover part is preferably molded so as to cover the entire winding coil and part of the magnetic core including the columnar core part while following a shape of the entire winding coil and a shape of part of the magnetic core.

In a small electronic component according to another embodiment of the present invention, the magnetic core preferably includes the columnar core part and a flange part extending in a direction orthogonal to an axial direction of the columnar core part.

According to one embodiment of the present invention, there is provided an electronic circuit board, including at least a wiring board having wiring patterned thereon and the small electronic component of the present invention connected to the wiring through soldering.

In an electronic circuit board according to one embodiment of the present invention, it is preferred that the wiring preferably further have another electronic component connected thereto.

According to one embodiment of the present invention, there is provided a method of manufacturing the small electronic component of the present invention, the method at least including: arranging a member to be covered in a space formed in a mold, the member to be covered including a magnetic core that includes at least a columnar core part and a winding coil which is arranged so as to surround an outer peripheral surface side of the columnar core part and is formed by winding a winding wire; and filling an uncured magnetic material containing a mixture of a phosphoric acid ester-based surfactant, magnetic powder, and a resin into the space, to thereby mold a shape of the magnetic material covering the member to be covered.

In a method of manufacturing the small electronic component according to one embodiment of the present invention, in the molding, a minimum clearance between an inner wall surface of the mold and the member to be covered is preferably 0.8 mm or less.

According to the present invention, it is possible to provide the small electronic component that is excellent in magnetic powder escape prevention ability, external electrode bonding property, withstand voltage characteristics, antirust ability, heat resistance, strength after heat curing, and moldability, the electronic circuit board using the small electronic component, and the method of manufacturing the small electronic component.

DETAILED DESCRIPTION OF THE PREFERRED EMBODIMENTS

<Small Electronic Component>

Figure 1:
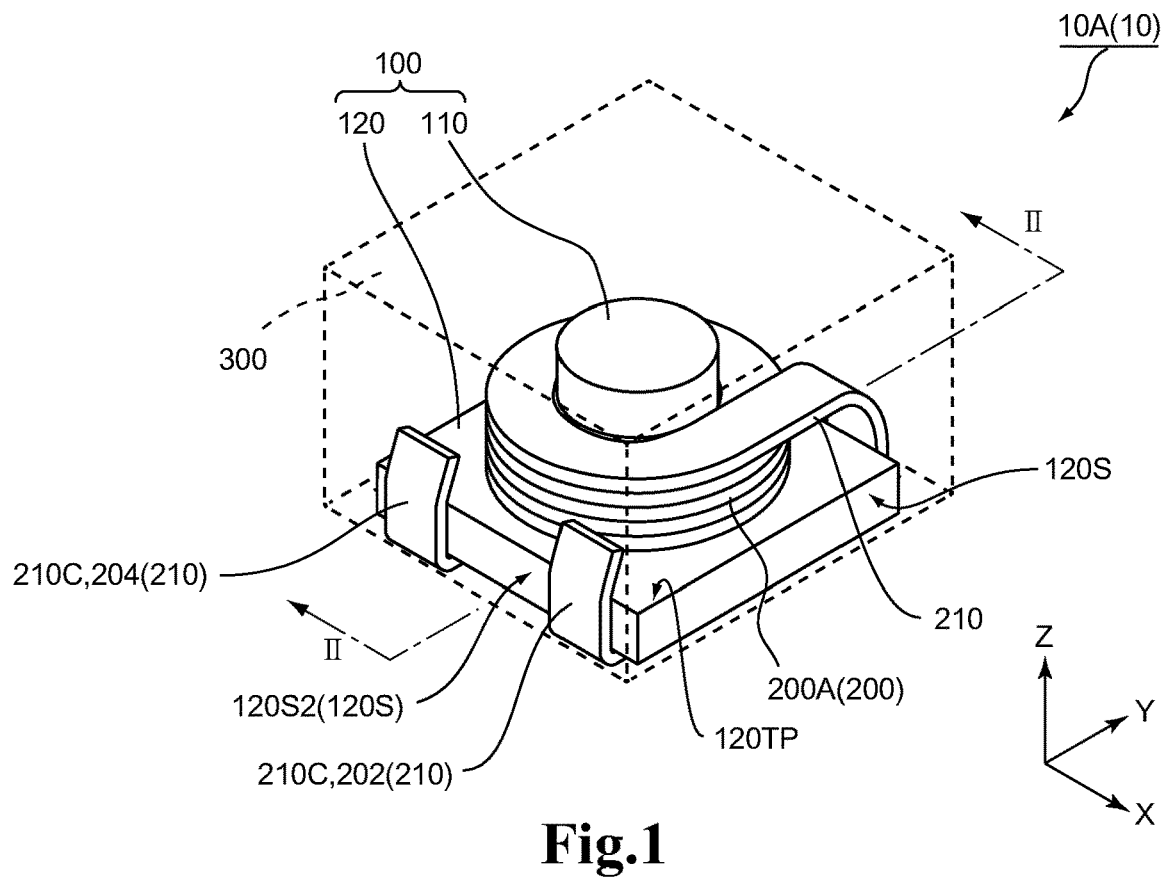
FIG. 1 is a perspective view for illustrating an example of a small electronic component according to an embodiment of the present invention.
Figure 2:
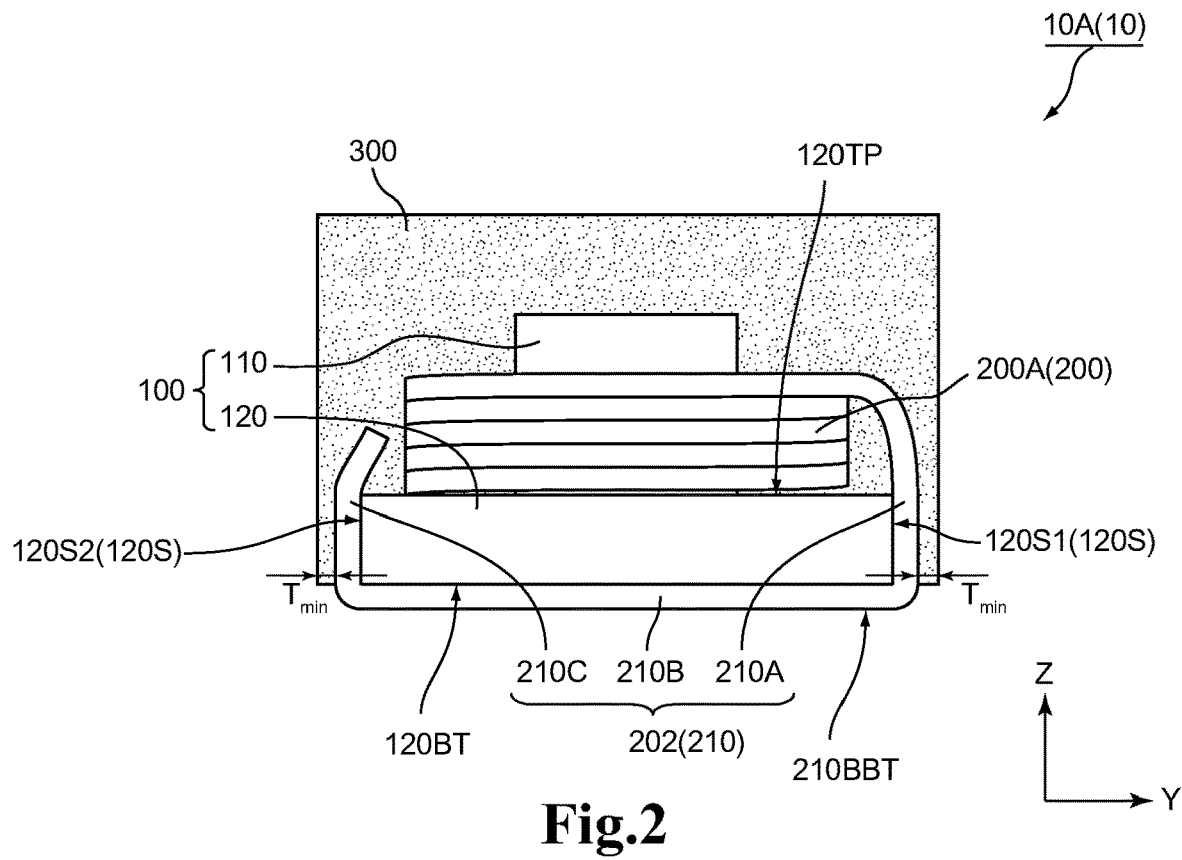
FIG. 2 is a schematic view for illustrating an internal structure of the small electronic component illustrated in FIG. 1.

FIG. 1 and FIG. 2 are each a schematic view for illustrating an example of a small electronic component according to an embodiment of the present invention. FIG. 1 is a perspective view for illustrating an internal structure of the small electronic component, and FIG. 2 is a view for illustrating the internal structure of the small electronic component illustrated in FIG. 1. In FIG. 1, a magnetic cover part is represented by the broken line, and a magnetic core and a winding coil covered with the magnetic cover part are represented by the solid line. Further, an X direction, a Y direction and a Z direction in FIG. 1 refer to directions that are orthogonal to each other. One side (upper side in FIG. 1) of the Z direction is referred as an upper part, an upper side, an upward side, or the like, and the other side (lower side in FIG. 1) of the Z direction is referred to as a bottom, a lower part, a lower side, a downward side, or the like. Those points also similarly apply to FIG. 2 and the following figures. Further, FIG. 2 is an illustration of the internal structure of the small electronic component when a small electronic component 10A(10) illustrated in FIG. 1 is viewed from the X direction. In FIG. 2, a sectional structure of a magnetic cover part 300 taken along the line II-II of FIG. 1 is illustrated, and side views of parts except for the magnetic cover part 300 are illustrated.

The small electronic component 10A illustrated in FIG. 1 includes a magnetic core 100 that includes a cylindrical columnar core part 110 and a plate-like flange part 120 arranged on one end side of the columnar core part 110, a winding coil 200A(200) which is arranged so as to cover an outer peripheral surface side of the columnar core part 110 and is formed by winding a winding wire 210, and the magnetic cover part 300 that is formed so as to cover the entire winding coil 200A and part of the magnetic core 100 including the columnar core part 110 while following the shapes thereof.

The plate-like flange part 120 has a plane surface (XY surface) with a substantially square shape and is arranged so as to extend in a direction orthogonal to an axial direction of the columnar core part 110 (direction parallel to the Z direction), which is positioned in a center portion of the plane surface. The winding coil 200A is mounted on an upper surface 120TP of the flange part 120 arranged on a lower end side of the columnar core part 110.

In this case, one end side of the winding wire 210 (first leading portion 202 of the winding coil 200A) extends in a direction parallel to the upper surface 120TP of the flange part 120 (one side of the Y direction) from an upper end side of the winding coil 200A (ia). Then, the leading portion 202 is bent downward so as to extend in parallel to a first side surface 120S1 of four side surfaces 120S of the flange part 120 and to be brought into close contact with the first side surface 120S1 (ii). Next, the leading portion 202 is bent so as to extend from one side to the other side of the Y direction in close contact with a lower surface 120BT of the flange part 120 (iii). Further, the leading portion 202 is bent upward again so as to be brought into close contact with a second side surface 120S2 (side surface 120S parallel to the first side surface 120S1) of the flange part 120 (iv). Finally, the leading portion 202 is bent obliquely so as to be tilted toward the columnar core part 110 on an upper end side of the second side surface 120S2 of the flange part 120 (v).

Therefore, the first leading portion 202 is formed of substantially three portions, that is, a first extension portion 210A corresponding to the above-mentioned parts (ia) and (ii), a second extension portion 210B corresponding to the above-mentioned part (iii), and a third extension portion 210C corresponding to the above-mentioned parts (iv) and (v).

Further, the other end side of the winding wire 210 (second leading portion 204 of the winding coil 200A) extends in a direction parallel to the upper surface 120TP of the flange part 120 (one side of the Y direction) from a lower end side of the winding coil 200A (ib). Then, the leading portion 204 is bent downward so as to extend in parallel to the first side surface 120S1 of the flange part 120 and to be brought into close contact with the first side surface 120S1 (ii). Next, the leading portion 204 is bent so as to extend from one side to the other side of the Y direction in close contact with the lower surface 120BT of the flange part 120 (iii). Further, the leading portion 204 is bent upward so as to be brought into close contact with the second side surface 120S2 of the flange part 120 (iv). Finally, the leading portion 204 is bent obliquely so as to be tilted toward the columnar core part 110 on the upper end side of the second side surface 120S2 of the flange part 120 (v).

Therefore, the second leading portion 204 is also formed of substantially three portions, that is, a first extension portion (not shown in FIG. 1 and FIG. 2) corresponding to the above-mentioned parts (ib) and (ii), a second extension portion 210B (not shown in FIG. 1 and FIG. 2) corresponding to the above-mentioned part (iii), and a third extension portion 210C corresponding to the above-mentioned parts (iv) and (v). The first leading portion 202 and the second leading portion 204 have substantially the same structure and shape except for the structure and shape of the first extension portion.

Here, the magnetic cover part 300 is arranged so as to cover, in addition to the winding coil 200A, the columnar core part 110, and the upper surface 120TP and the four side surfaces 120S of the flange part 120, the winding wire 210 (first extension portion 210A and first extension portion of the second leading portion 204 (not shown in FIG. 1 and FIG. 2)) that is in close contact with the first side surface 120S1 and the winding wire 210 (two third extension portions 210C) that is in close contact with the second side surface 120S2, while following the shapes thereof. In other words, only the lower surface 120BT of the flange part 120 and the winding wire 210 arranged on the lower surface 120BT side (two second extension portions 210B) are not covered with the magnetic cover part 300. In the small electronic component 10A having a substantially hexahedral shape, only one of the six surfaces is formed of the lower surface 120BT of the flange part 120, and the remaining five surfaces are formed of the magnetic cover part 300.

Therefore, at the time of surface mounting of the small electronic component 10A, the two second extending portions 210B each extending on the bottom surface 120BT side of the flange part 120 function as an external electrode to be connected to wiring formed on a wiring board. In the winding wire 210, a conductive core material formed of copper or the like is coated with an insulating coating. Therefore, the insulating coating of at least a portion of the winding wire 210 functioning as the external electrode (the second extending portions 210B on a bottom surface 210BBT side in the example illustrated in FIG. 2) is peeled off.

Meanwhile, the magnetic cover part 300 is formed through use of a magnetic material containing a mixture of a phosphoric acid ester-based surfactant, magnetic powder, and a resin. Therefore, the small electronic component 10 of this embodiment is excellent in (1) magnetic powder escape prevention ability, (2) external electrode bonding property, (3) withstand voltage characteristics, (4) antirust ability, (5) heat resistance, (6) strength after heat curing, and (7) moldability as compared to the electronic component presented as an example in Chinese Patent Application Publication No. 104051129 in which the magnetic material containing a mixture of only the magnetic powder and the resin is used for the formation of the magnetic cover part. In addition, the small electronic component 10 of this embodiment extremely easily eliminates the need for coating treatment by virtue of being excellent in the characteristics (1) to (4). Besides, even when the coating treatment is performed, a coating film is less liable to be peeled off under a high-temperature and high-humidity environment or at the time of heating at high temperature because the small electronic component 10 is excellent in the characteristic (1).

The related-art magnetic material containing a mixture of only the magnetic powder and the resin tends to be inferior in insulation resistance, dielectric strength, antirust ability, and flowability because the resin has low wettability to the magnetic powder. The cause for this is that the resin has low affinity for the magnetic powder, and hence particles of the magnetic powder each having a small particle diameter aggregate, and the dispersion state of the magnetic powder in the magnetic material is poor.

In order to solve such problem, it is suitable to use a surfactant as a dispersant. However, the small electronic component 10 of this embodiment is utilized in surface mounting applications, and hence the small electronic component 10 is also required to have heat resistance enough to withstand a heating process at the time of surface mounting. Specifically, it is also important that the magnetic characteristics of the magnetic cover part 300 do not largely change through heating at the time of soldering using a reflow furnace or at the time of soldering adopting a spot reflow method utilizing, for example, a mode of jetting hot air from a nozzle. In addition, with regard to a heating temperature at the time of surface mounting, the surface mounting is often performed within a temperature range of more than 200° C. (for example, a temperature range of about 260° C.±35° C.). However, the small electronic component 10 of this embodiment uses, as a dispersant, the phosphoric acid ester-based surfactant additionally excellent in heat resistance as compared to other surfactants, and hence is also excellent in heat resistance.

In addition, the magnetic material containing a mixture of the phosphoric acid ester-based surfactant, the magnetic powder, and the resin (the magnetic material in an uncured state to be used for formation of the magnetic cover part 300) is excellent in flowability, and hence is extremely easily filled even in a narrow gap at the time of molding as compared to the related-art magnetic material. Therefore, also the thickness of the magnetic cover part 300 is easily reduced. Accordingly, the small electronic component 10 of this embodiment more easily achieves a complicated structure and shape and a reduction in size. The minimum thickness of the magnetic cover part 300 is preferably 0.8 mm or less, more preferably 0.5 mm or less. The lower limit of the minimum thickness is not particularly limited, but is practically preferably 0.1 mm or more because an excessively small minimum thickness is liable to cause peeling or chipping of the magnetic cover part 300, and further, also cause a filling failure at the time of molding.

The thickness of the magnetic cover part 300 means the thickness in a direction orthogonal to the surface of a member covered with the magnetic cover part 300 (member to be covered) (excluding the thickness of a portion in which the thickness is thinned unintentionally due to chipping, peeling, and the like). In this case, in the small electronic component 10A illustrated in FIG. 2, the minimum thickness of the magnetic cover part 300 is, for example, a distance $T_{min}$ between the surface of the winding wire 210 positioned on the first side surface 120S1 side and the second side surface 120S2 side of the flange part 120, and the side surface of the magnetic cover part 300.

Next, the components forming the magnetic material and their blending ratios are described. A known phosphoric acid ester compound may appropriately be utilized as the phosphoric acid ester-based surfactant, and examples thereof may include a polyoxyethylene alkyl ether phosphoric acid ester, e.g., (C12-15) pareth-3 phosphate, (C12-15) pareth-9 phosphate, or (C12-15) pareth-6 phosphate, and a salt thereof, and an alkyl phosphate.

A known thermosetting resin may be used as the resin, and examples thereof may include an epoxy resin, a phenol resin, and a silicone resin. Of those resins, an epoxy resin, which is excellent in heat resistance, is particularly preferably used.

Metal magnetic powder containing iron as a main component and appropriately having added thereto a metal element, e.g., chromium (Cr), silicon (Si), or manganese (Mn), or a non-metal element, e.g., carbon (C), may be used as the magnetic powder. The average particle diameter of the magnetic powder is not particularly limited, but is preferably set to from about 1 μm to about 100 μm.

Further, there is no particular limitation on the blending ratio of each component forming the magnetic material. However, from the viewpoint of more easily ensuring the above-mentioned characteristics (1) to (7) with satisfactory balance, it is preferred that the following expressions (1) and (2A) to (5A) be satisfied, and it is more preferred that the following expression (1) and expressions (2B) to (5B) be satisfied.

$$D+M+R=100 \quad \text{Expression (1)}$$

$$M \geq 90.5 \quad \text{Expression (2A)}$$

$$R \geq 3.5 \quad \text{Expression (3A)}$$

$$R \leq -M+99.95 \quad \text{Expression (4A)}$$

$$R \geq -M+96.5 \quad \text{Expression (5A)}$$

$$M \geq 90.9 \quad \text{Expression (2B)}$$

$$R \geq 4.0 \quad \text{Expression (3B)}$$

$$R \leq -M+99.9 \quad \text{Expression (4B)}$$

$$R \geq -M+97.0 \quad \text{Expression (5B)}$$

Herein, in each of the expressions, D represents the content (mass %) of the phosphoric acid ester-based surfactant in the magnetic material, M represents the content (mass %) of the magnetic powder in the magnetic material, and R represents the content (mass %) of the resin in the magnetic material.

In addition, as the magnetic core 100, there may be utilized a ferrite core obtained by firing ferrite, or a compact core obtained by compression-molding magnetic powder. As the magnetic powder for the compact core, magnetic powder containing iron (Fe) as a main component and having added thereto each of silicon (Si) and chromium (Cr) at a ratio of 1 mass % or more and 10 mass % or less is preferably used. Such magnetic powder is excellent in terms of antirust property, relative magnetic permeability, and the like. From the viewpoint of reducing a core loss, magnetic powder obtained by mixing the above-mentioned magnetic powder and an amorphous metal may be used. As the amorphous metal, a carbon-containing amorphous metal containing iron (Fe) as a main component, each of silicon (Si) and chromium (Cr) at a ratio falling within a range of 1 mass % or more and 10 mass % or less, and further carbon (C) at a ratio falling within a range of 0.1 mass % or more and 5 mass % or less may be used.

The structure of the small electronic component 10 according to this embodiment is not limited to the small electronic component 10A illustrated in FIG. 1 as long as the structure includes the magnetic core 100 that includes at least the columnar core part 110, the winding coil 200 that is arranged so as to surround the outer peripheral surface side of the columnar core part 110, and the magnetic cover part 300 that is molded so as to cover at least part of the magnetic core 100 and the winding coil 200 while following the shapes thereof.

The magnetic core 100 may include, for example, only the columnar core part 110, and as illustrated in FIG. 1, the magnetic core 100 may include the columnar core part 110 and the flange part 120 that extends in a direction orthogonal to the axial direction of the columnar core part 110. Further, there is no particular limitation on the arrangement position and number of the flange part 120. As illustrated in FIG. 1, the flange part 120 may be arranged only on one end side of the columnar core part 110, but may also be arranged at both ends of the columnar core part 110 or in the vicinity of the center portion in the axial direction of the columnar core part 110.

The winding wire 210 forming the winding coil 200 is a conductive wire rod made of copper or the like covered with an insulating film, and may be a flat wire as illustrated in FIG. 1 or a round wire. Further, the winding coil 200 may be formed by single winding of the winding wire 210 as illustrated in FIG. 1 or may be formed by multiple winding of the winding wire 210. Further, when the winding wire 210 is a flat wire, the winding wire 210 may be wound by an edgewise method involving winding the flat wire so that a short side of a cross-section of the flat wire is positioned on an inner diameter side of the winding coil 200 as illustrated in FIG. 1, or may be wound by a flatwise method involving winding the flat wire so that a long side of the cross-section of the flat wire is positioned on the inner diameter side of the winding coil 200.

Further, it is only necessary that the magnetic cover part 300 be molded so as to cover at least part of the magnetic core 100 and the winding coil 200 while following the shapes thereof. However, the magnetic cover part 300 may also be molded so as to cover the entire winding coil 200 and part of the magnetic core 100 including the columnar core part 110 while following the shapes thereof as illustrated in FIG. 1, or may be molded so as to cover the entire winding coil 200 and the entire magnetic core 100 while following the shapes thereof. As illustrated in FIG. 1, when the magnetic core 100 includes the flange part 120, it is generally preferred that a surface of the flange part 120 on a side on which the winding coil 200 is provided (upper surface 120TP in the example illustrated in FIG. 1) be also covered with the magnetic cover part 300. Further, in the example illustrated in FIG. 1, the magnetic cover part 300 covers all the four side surfaces 120S of the flange part 120, but not all the four side surfaces 120S of the flange part 120 may not be covered with the magnetic cover part 300.

Further, as illustrated in FIG. 2, an end portion of the winding wire 210 led from the winding coil 200 may be exposed outside from the small electronic component 10 (at least from a mounting surface of the small electronic component 10 (lower surface 120BT of FIG. 2)), to thereby form an external electrode (i). However, the end portion of the winding wire 210 may not be exposed outside from the small electronic component 10 at all by being covered with the magnetic cover part 300 (ii), or may be exposed outside from the small electronic component 10 (only from portions except for the mounting surface of the small electronic component 10) (iii). In the case of (ii) and (iii), in general, it is particularly preferred that the end portion of the winding wire 210 be connected to an auxiliary terminal that serves as an external electrode formed of a conductive member, e.g., copper. The insulating film of a portion of the winding wire 210 to be connected to the auxiliary terminal is removed in advance.

Further, in the small electronic component according this embodiment, portions except for at least the portion serving as the external electrode may be subjected to coating treatment with a coating film as necessary. The coating film is generally formed so as to cover a surface of the magnetic cover part 300. As a coating agent to be used for forming the coating film, there may be given, for example, an epoxy resin coating, a fluorocoating, a polyamide imide resin coating, a silicone-modified epoxy resin coating, and a parylene coating.

Figure 3:
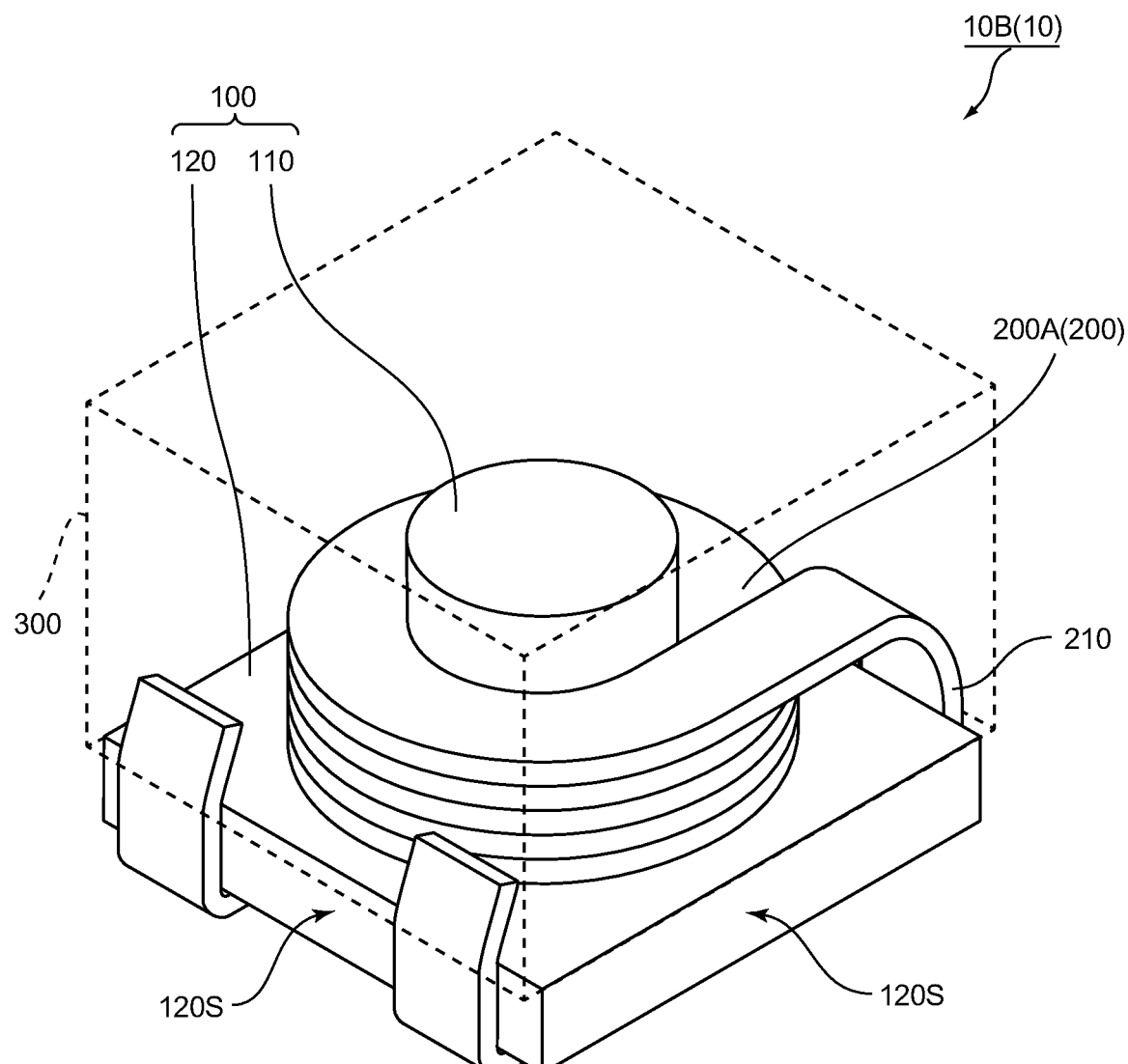
FIG. 3 is a perspective view for illustrating another example of the small electronic component according to the embodiment of the present invention.

FIG. 3 is a perspective view for illustrating another example of the small electronic component according to this embodiment. In FIG. 3, the magnetic cover part 300 is represented by the broken line, and the magnetic core 100 and the winding coil 200A covered with the magnetic cover part 300 are represented by the solid line. A small electronic component 10B(10) illustrated in FIG. 3 has the same structure as the small electronic component 10A illustrated in FIG. 1 except that the side surfaces of the flange part 120 are not covered with the magnetic cover part 300, and four side surfaces of the magnetic cover part 300 are formed so as to be substantially flush with the four side surfaces 120S of the flange part 120.

Figure 4:
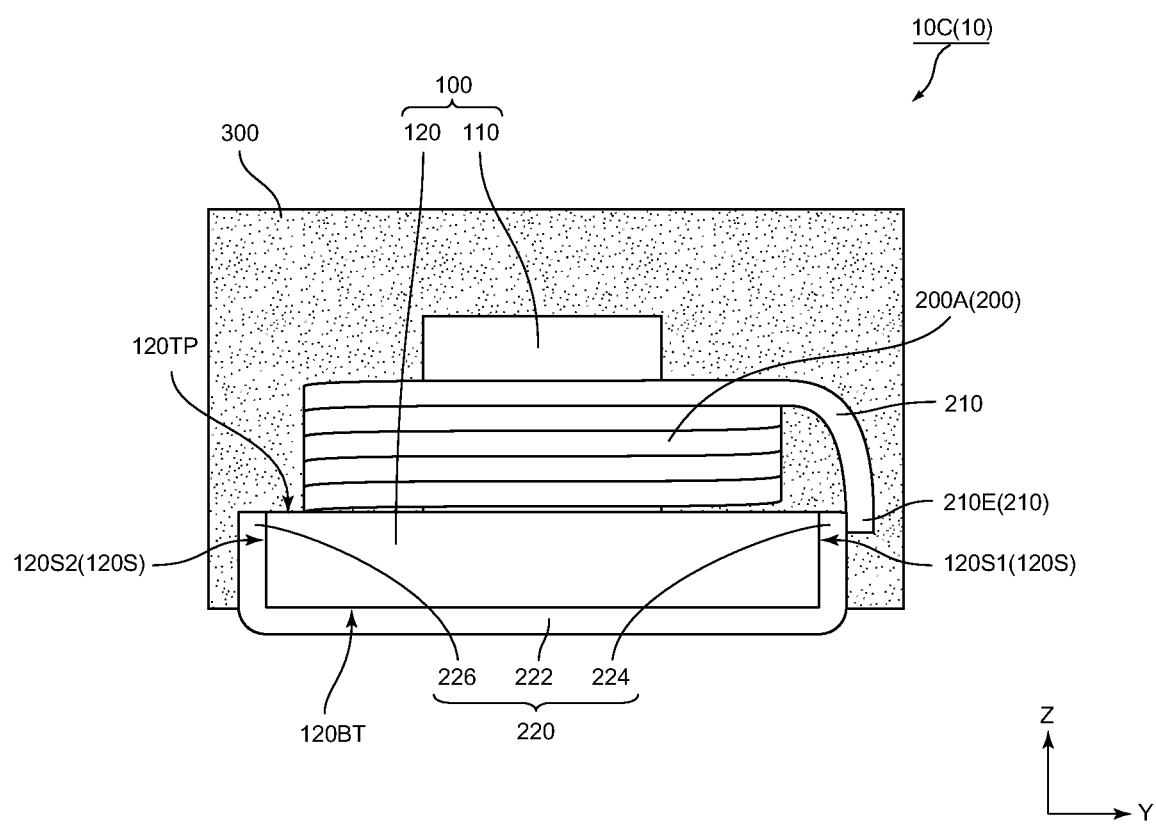
FIG. 4 is a sectional view for illustrating another example of the small electronic component according to the embodiment of the present invention.

FIG. 4 is a sectional view for illustrating another example of the small electronic component according to this embodiment. A small electronic component 10C(10) illustrated in FIG. 4 is the same as the small electronic component 10A illustrated in FIG. 1 and FIG. 2 regarding the magnetic core 100 and the winding coil 200A. However, the small electronic component 10C illustrated in FIG. 4 is different from the small electronic component 10A in that the leading portions 202 and 204 of the winding wire 210 in the small electronic component 10A illustrated in FIG. 1 and FIG. 2 have a structure of being divided into two portions. That is, in the small electronic component 10C illustrated in FIG. 4, a distal end 210E of the winding wire 210 is positioned in the vicinity of an upper end of the first side surface 120S1 of the flange part 120 and is connected to an auxiliary terminal 220. In this case, the auxiliary terminal 220 is formed of a main body portion 222 arranged in close contact with the lower surface 120BT of the flange part 120 so as to extend from the first side surface 120S1 side to the second side surface 120S2 side of the flange part 120, a first side end portion 224 arranged in close contact with the first side surface 120S1 from an end of the main body portion 222 on the first side surface 120S1 side to an upper end side of the first side surface 120S1, and a second side end portion 226 arranged in close contact with the second side surface 120S2 from an end of the main body portion 222 on the second side surface 120S2 to an upper end side of the second side surface 120S2. The auxiliary terminal 220 is connected to the distal end 210E of the winding wire 210 on the upper end side of the first side end portion 224, and the main body portion 222 serves as an external electrode connected to wiring formed on a wiring board. Further, the magnetic cover part 300 covers the portions except for the lower surface 120BT of the flange part 120 and the main body portion 222 of the auxiliary terminal 220 arranged on the lower surface 120BT side. That is, the end portion of the winding wire 210 is not exposed outside from the small electronic component 10C. Further, the auxiliary terminal 220 is fixed to the lower surface 120BT of the flange part 120 when the first side end portion 224 and the second side end portion 226 positioned at both ends of the auxiliary terminal 220 are covered with the magnetic cover part 300.

Figure 5:
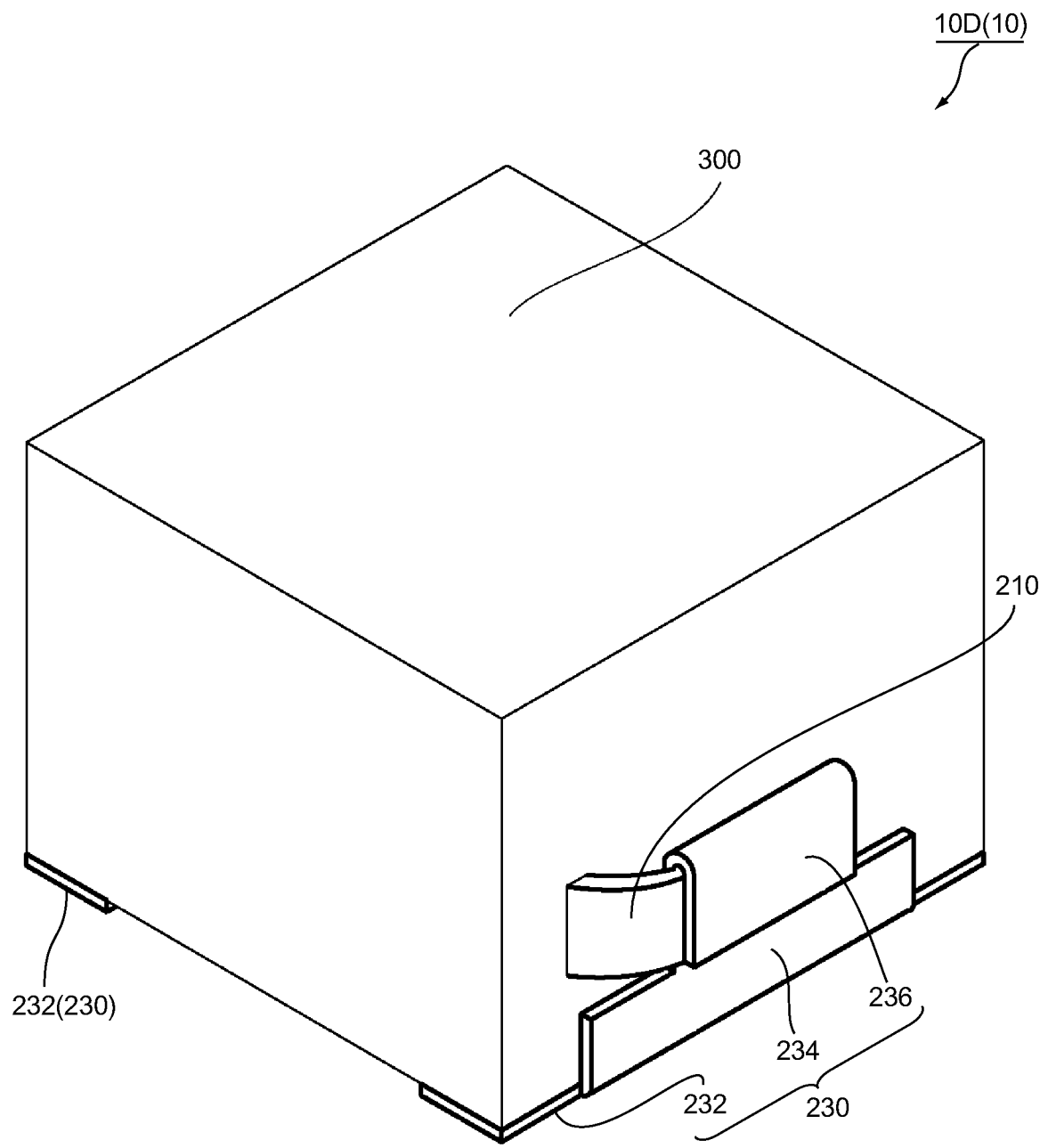
FIG. 5 is a perspective view of an outer appearance for illustrating another example of the small electronic component according to the embodiment of the present invention.
Figure 6:
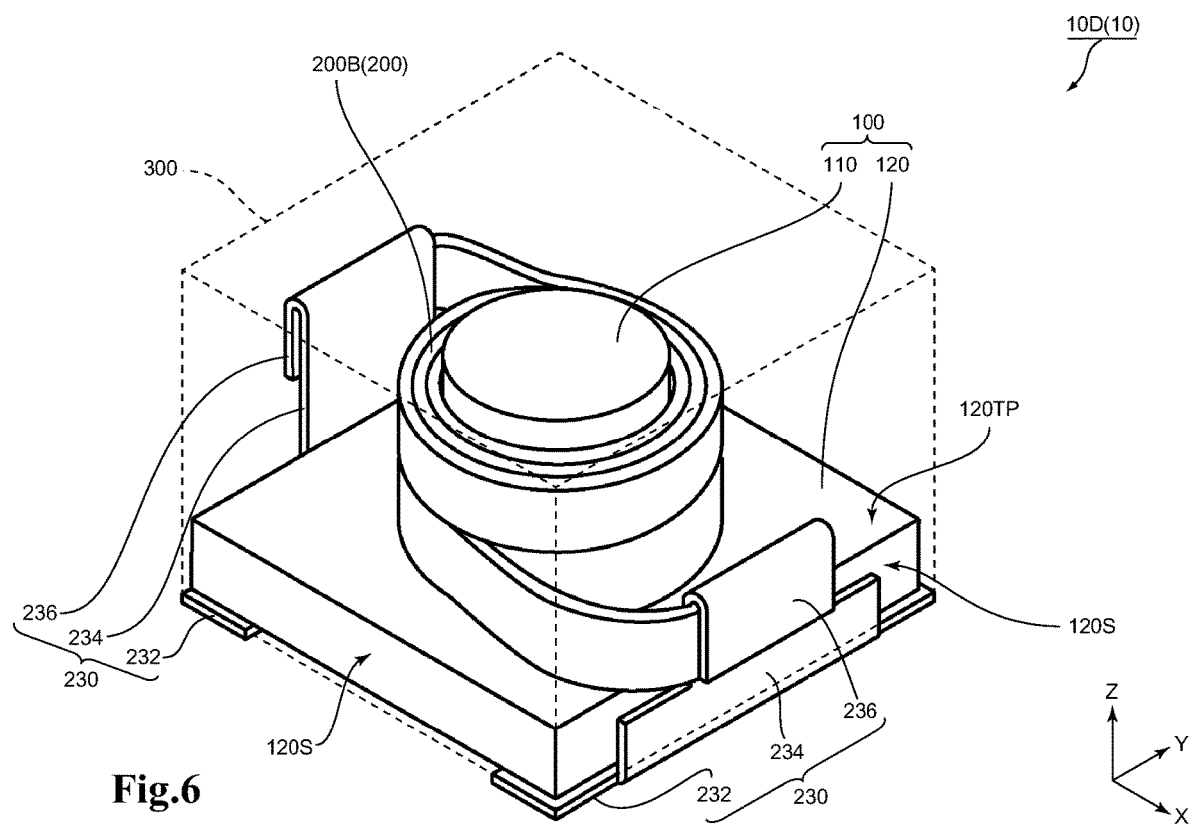
FIG. 6 is a perspective view for illustrating an example of an internal structure of the small electronic component illustrated in FIG. 5.

FIG. 5 and FIG. 6 are each a perspective view for illustrating another example of the small electronic component according to this embodiment. FIG. 5 is a perspective view of an outer appearance of the small electronic component, and FIG. 6 is a perspective view for illustrating an internal structure of the small electronic component illustrated in FIG. 5. The magnetic cover part is represented by the broken line, and the magnetic core and the winding coil covered with the magnetic cover part are represented by the solid line.

In a small electronic component 10D(10) illustrated in FIG. 5 and FIG. 6, each end portion of the winding wire 210 is exposed from a side surface of an outer portion of the small electronic component 10D (magnetic cover part 300) and is connected to an auxiliary terminal 230. The auxiliary terminal 230 has a bottom surface portion 232 which is arranged in close contact with a bottom surface of the small electronic component 10D (lower surface 120BT of the flange part 120) and serves as an external electrode, a side surface portion 234 arranged in close contact with a side surface of the small electronic component 10D (side surface of the magnetic cover part 300), standing from the bottom surface portion 232 so as to be orthogonal to the bottom surface portion 232, and a fixing portion 236 configured to fix the end portion of the winding wire 210 so that the end portion is interposed between the side surface portion 234 and the fixing portion 236 by bending an upper end side of the side surface portion 234 downward. In this case, the auxiliary terminal 230 is fixed to the lower surface 120BT of the flange part 120 with an adhesive or the like. Further, the end portion of the winding wire 210 is connected to the auxiliary terminal 230 through crimping, welding (laser welding, arc welding, ultrasonic welding, or the like) or soldering. Further, the height of the side surface portion 234 of one (on the right side of FIG. 6) of the two auxiliary terminals 230 is set to be lower than that of the side surface portion 234 of the other (on the left side of FIG. 6).

The magnetic core 100 is the same as that illustrated in FIG. 1. Further, the winding coil 200B(200) is formed by winding the winding wire 210, which is a flat wire, by a flatwise method, and is wound so as to form two layers along an axial direction of the columnar core part 110. Further, the magnetic cover part 300 is arranged so as to cover the entire winding coil 200B, the columnar core part 110 of the magnetic core 100, and the upper surface 120TP and the four side surfaces 120S of the flange part 120.

The small electronic component 10 according to this embodiment is an electronic component for surface mounting, and can be used as, for example, an inductor, a transformer, a filter, or the like. However, the usage of the small electronic component 10 in application to a reactor, which is large and is not used by being connected to a wiring board that is used with components for surface mounting, is excluded. Further, the mass of the small electronic component 10 is from about 0.01 g to about 100 g (more preferably from 0.05 g to 80 g), and the volume thereof is from about 10 $mm^3$ to 100,000 $mm^3$ (more preferably from 50 $mm^3$ to 10,000 $mm^3$).

<Electronic Circuit Board>

An electronic circuit board according to this embodiment includes at least a wiring board having wiring patterned thereon and the small electronic component 10 according to this embodiment connected to the wiring through soldering. As a substrate forming the wiring board, in the case where the wiring board is a rigid substrate having no flexibility, there can be given (i) a paper phenol substrate obtained by impregnating paper with a phenol resin, (ii) a paper epoxy substrate obtained by impregnating paper with an epoxy resin, (iii) a glass epoxy substrate obtained by impregnating laminated glass fibers cut to an even length with an epoxy resin or by impregnating stacked cloths made of glass fibers with an epoxy resin, (iv) a ceramic substrate made of alumina or the like, (v) a composite substrate obtained by combining and laminating two or more kinds of the rigid substrates (i) to (iv) listed above, and the like. Further, in the case where the wiring board is a flexible substrate having flexibility, resin films such as a polyimide film and a polyester film can be given. Further, the wiring is generally made of copper, and the wiring is patterned by a subtractive method involving removing an unnecessary portion from a substrate having a copper foil formed thereon, to thereby form wiring having a predetermined pattern, or an additive method involving masking a portion in which a pattern is not intended to be formed, and then forming wiring by a known film formation method, e.g., a plating method or an evaporation method.

Further, in general, other electronic components are also connected to the wiring in addition to the small electronic component 10 according to this embodiment. As the other electronic components, one or more known electronic components are used in accordance with the purpose and application of the electronic circuit board. As such electronic components, there may be given, for example, an electronic component including a winding coil except for the small electronic component 10 according to this embodiment, a capacitor, a semiconductor element, e.g., an IC chip, a resistor element, a diode, a light-emitting element, and a light-receiving element.

<Method of Manufacturing Small Electronic Component>

The small electronic component 10 according to this embodiment is manufactured through use of a mold. Specifically, the small electronic component 10 according to this embodiment can be manufactured through at least a molding step of arranging a member to be covered in a space formed in a mold, the member to be covered including the magnetic core 100 that includes at least the columnar core part 110 and the winding coil 200 which is arranged so as to surround the outer peripheral surface side of the columnar core part 110 and is formed by winding the winding wire 210, and filling an uncured magnetic material containing a mixture of a phosphoric acid ester-based surfactant, magnetic powder, and a resin into the space, to thereby mold a shape of the magnetic material covering the member to be covered.

In the molding step, the minimum clearance between an inner wall surface of the mold and the member to be covered is preferably 0.8 mm or less, more preferably 0.5 mm or less. With this, it becomes easy to further downsize the small electronic component 10 to be manufactured and to achieve a complicated structure and shape. There is no particular limitation on the lower limit of the minimum clearance. However, when the minimum clearance is excessively small, peeling, chipping, and the like of the magnetic cover part 300 are liable to occur, and a filling failure is liable to occur when the magnetic material is filled into the mold. Therefore, for practical use, it is preferred that the minimum clearance be 0.1 mm or more.

Further, the "clearance" between the inner wall surface of the mold and the member to be covered means a gap that is formed intentionally for the purpose of covering the member to be covered with the magnetic cover part 300 in the small electronic component 10 to be manufactured.

Herein, the magnetic material in an uncured state is particularly preferably prepared by the following procedure. First, a first mixture is produced through a first mixing step of mixing the magnetic powder, the phosphoric acid ester-based surfactant, and a solvent. Next, a second mixture is produced through a second mixing step of mixing the first mixture and the resin. As the magnetic material in an uncured state to be used in the molding step, the second mixture may be directly utilized or utilized after drying treatment for removing the solvent in the second mixture. However, when the second mixture containing the solvent is directly utilized as the magnetic material in an uncured state, it is necessary to perform, after filling of the magnetic material in an uncured state in a mold in the molding step, drying treatment for removing the solvent before curing of the magnetic material. For example, the following known organic solvent may be appropriately utilized as the solvent: acetone, methyl ethyl ketone (MEK), ethanol, α-terpineol, or isopropyl alcohol (IPA).

In addition, through the first mixing step, a phosphate group of the phosphoric acid ester-based surfactant adsorbs onto the surface of the magnetic powder. With this, the wettability of the magnetic powder to the resin can be improved in advance. Therefore, after the second mixing step, the aggregation of the magnetic powder (in particular, particles of the magnetic powder each having a small particle diameter) is prevented, and thus the dispersibility of the magnetic powder in the resin can be improved. Accordingly, as compared to the case of using the conventional magnetic material formed only of the magnetic powder and the resin, the flowability of the magnetic material in an uncured state can be improved in the molding step, and hence the moldability can be improved. Besides, in a state of the small electronic component, the withstand voltage characteristics, the antirust ability, and the like can be improved.

Figure 7:
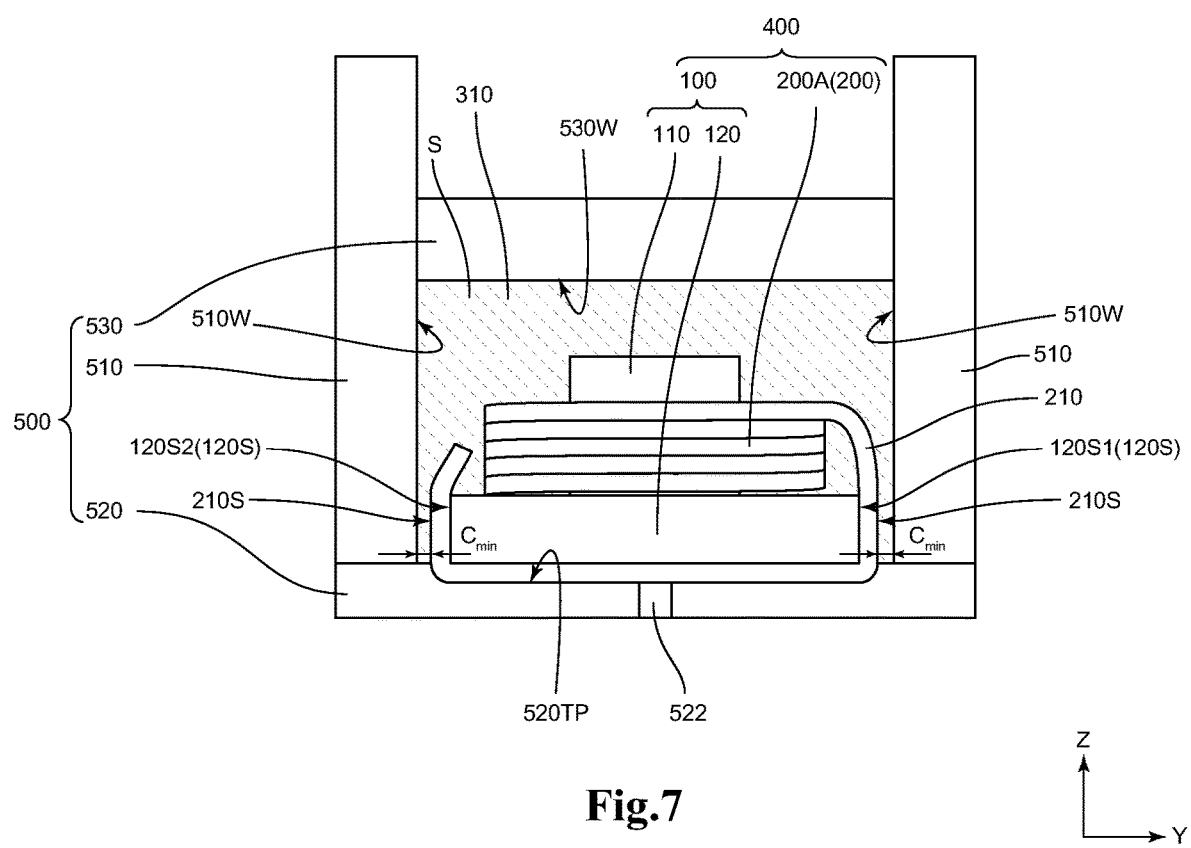
FIG. 7 is a schematic view for illustrating an example of a method of manufacturing the small electronic component according to the embodiment of the present invention.

FIG. 7 is a schematic view for illustrating an example of a method of manufacturing the small electronic component according to this embodiment, and specifically, illustrating an example of a molding step in the case of manufacturing the small electronic component 10A illustrated in FIG. 1. In the example illustrated in FIG. 7, a member to be covered 400 is arranged in a space S formed in a mold 500 formed of a plurality of members. The member to be covered 400 is the same as a combination of the magnetic core 100 and the winding coil 200A illustrated in FIG. 1. Further, the mold 500 includes a tubular first mold body 510 having a hollow portion penetrating therethrough in a vertical direction, a second mold body 520 arranged so as to seal an opening on a lower side of the first mold body 510, and a third mold body 530 arranged in the first mold body 510 through an opening on an upper side of the first mold body 510. The planar shape and size of the third mold body 530 are the same as those of the opening on the upper end side of the first mold body 510.

The second mold body 520 also serves as a mount base on which the member to be covered 400 is mounted, and a mount surface 520TP on which the member to be covered 400 is mounted has an uneven shape corresponding to a bottom surface shape of the member to be covered 400. Further, a vent hole 522 is formed in a center portion of the second mold body 520 so that air present in advance in the space S can be discharged outside from the space S when a magnetic material in an uncured state (uncured magnetic material 310) is filled into the space S formed in the mold 500. In the example illustrated in FIG. 7, the second mold body 520 is a member separate from the first mold body 510, but the first mold body 510 and the second mold body 520 may be formed integrally.

When the small electronic component 10A is manufactured, first, the member to be covered 400 is mounted on a bottom surface of a mold frame having a U-shaped cross-section (mount surface 520TP), which is formed by the first mold body 510 and the second mold body 520 arranged so as to seal the opening on the lower surface side of the first mold body 510. In the example illustrated in FIG. 7, a gap formed between each surface 210S of the winding wire 210 positioned on the first side surface 120S1 side and the second side surface 120S2 side of the flange part 120 of the magnetic core 100 forming the member to be covered 400 and an inner wall surface 510W of the first mold body 510 is set to a minimum clearance $C_{min}$. However, the place in which the minimum clearance $C_{min}$ is formed is not limited to the example illustrated in FIG. 7.

Next, the uncured magnetic material 310 in a putty state is filled into the space S in the mold frame having a U-shaped cross-section, which is formed by the first mold body 510 and the second mold body 520. The uncured magnetic material 310 is filled into the space S through the opening on the upper end side of the first mold body 510. Then, the third mold body 530 is arranged in the first mold body 510 through the opening on the upper end side of the first mold body 510 so as to cover the uncured magnetic material 310 filled into the space S. At this time, after the uncured magnetic material 310 is filled into the mold frame having a U-shaped cross-section, which is formed by the first mold body 510 and the second mold body 520, the third mold body 530 is pushed into the mold frame so that the magnetic cover part 300 can be molded under a low pressure of 3 MPa or less (so-called low-pressure molding). In this case, the shape of the magnetic material 310 is changed but the volume thereof is hardly changed before and after filling. With this, in the space S formed in the mold 500, the member to be covered 400 is covered with the uncured magnetic material 310 following the shape of the member to be covered 400, and the shape of the magnetic cover part 300 is molded. In the case where the uncured magnetic material 310 further contains a solvent, it is appropriate that the uncured magnetic material 310 filled into the space S in the mold frame having a U-shaped cross-section, which is formed by the first mold body 510 and the second mold body 520, be sufficiently dried, and then the third mold body 530 be arranged in the first mold body 510.

In the molding step illustrated in FIG. 7, the planar shape and size of the third mold body 530 are the same as those of the opening on the upper end side of the first mold body 510. However, the size in a planar direction of the third mold body 530 may be slightly larger than that of the opening on the upper end side of the first mold body 510. In the latter case, it is appropriate that the uncured magnetic material 310 be filled into the space S in the mold frame having a U-shaped cross-section, which is formed by the first mold body 510 and the second mold body 520, to such a degree that the uncured magnetic material 310 overflows the first mold body 510 a little from the opening on the upper end side thereof, and then the third mold body 530 be arranged so as to push out the excessive uncured magnetic material 310 overflowing the first mold body 510 from the opening thereof to the periphery and to seal the opening on the upper end side of the first mold body 510.

Further, in the molding step, the third mold body 530 may not be used. In this case, the uncured magnetic material 310 is filled into the space S in the mold frame having a U-shaped cross-section, which is formed by the first mold body 510 and the second mold body 520, to such a degree that the uncured magnetic material 310 overflows the first mold body 510 a little from the opening on the upper end side thereof, and then the excessive uncured magnetic material 310 overflowing the first mold body 510 from the opening thereof is removed with a blade or the like, thereby being capable of molding the shape of an upper surface of a portion to become the magnetic cover part 300 (low-pressure molding).

The uncured magnetic material 310 may be thermally cured substantially simultaneously with the molding step, or may be thermally cured after the molding step is finished and the member to be covered 400, which is covered with the uncured magnetic material 310 formed into the shape corresponding to the magnetic cover part 300, is removed from the mold 500. Through heat curing, the magnetic cover part 300 formed of a (cured) magnetic material is formed. After heat curing, various post-processes such as polishing treatment of the surface of the magnetic cover part 300 may be performed as necessary. With this, the small electronic component 10A illustrated in FIG. 1 can be obtained.

EXAMPLES

Now, the present invention is described by way of examples, but the present invention is not limited to only those examples described below.

<Magnetic Material>

Magnetic materials having compositions shown in Comparative Example 1 and Examples 1 to 12 of Table 1 were each prepared as a magnetic material. The details of the magnetic powder, the resin, and the dispersant to be used for the preparation of each magnetic material are as described below. In addition, each magnetic material was prepared through a first mixing step and a second mixing step through use of acetone as a solvent, followed by drying treatment, and was used as the uncured magnetic material 310 to be used in a molding step.

Magnetic Powder

Mixture of magnetic powder formed of Fe—Si—Cr and an additional trace element and amorphous powder, average particle diameter: 3 μm to 40 μm Resin Epoxy resin (FC Hard A-2400K5, Resinous Kasei Co., Ltd.)

Dispersant

Phosphoric acid ester-based surfactant (PHOSPHANOL RS-610 ((C12-15) pareth-6 phosphate), Toho Chemical Industry Co., Ltd.)

<Evaluation>

Each of evaluation samples produced by using the magnetic materials was evaluated for its moldability, magnetic powder escape prevention ability, external electrode bonding property, withstand voltage characteristics, antirust ability, coating film adhesiveness, heat resistance, and strength after heat curing. In each evaluation item, the details of a method of producing each evaluation sample, a test method, and judgment criteria are as described below.

(Moldability)

The moldability was evaluated by the following procedure. First, a molding step illustrated in FIG. 7 was performed, and then the uncured magnetic material 310 was heat-cured in the mold 500 (heat curing conditions: about 150° C. and 0.5 hour). Thus, the small electronic component 10A illustrated in FIG. 1 was produced. At this time, the small electronic component 10A illustrated in FIG. 1 was produced by appropriately changing the minimum clearance $C_{min}$ illustrated in FIG. 7 within a range of from 0.4 mm to 1.0 mm. After the production of the small electronic component 10A, a portion providing the minimum thickness $T_{min}$ of FIG. 2 corresponding to the minimum clearance $C_{min}$ of FIG. 7 was observed with an optical microscope, and thus whether or not the magnetic material was filled in a gap portion having the minimum clearance $C_{min}$ with no gap in the molding step was judged. The judgment criteria for the evaluation results shown in Table 1 are as described below.

—Judgment Criteria—
A: The magnetic material is filled with no gap even at a $C_{min}$ of 0.5 mm or less.
B: The magnetic material is filled with no gap at a $C_{min}$ within a range of more than 0.5 mm and 0.8 mm or less.
C: The magnetic material cannot be filled with no gap at a $C_{min}$ of 0.8 mm or less (a filling failure occurs).

(Magnetic Powder Escape Prevention Ability)

The magnetic powder escape prevention ability was evaluated by measuring the surface roughness Ra of an upper surface portion of a surface portion of the magnetic cover part 300 of the small electronic component 10A used for the evaluation of the moldability, the upper surface portion having been brought into contact with the inner wall surface 530W of the third mold body 530 in the molding step. Herein, the surface roughness Ra was measured with a surface roughness measuring instrument (SV-3000, manufactured by Mitutoyo Corporation) under the conditions of a reference length of 0.8 mm and an evaluation length of 4.0 mm. The judgment criteria for the evaluation results shown in Table 1 are as described below. The surface roughness Ra of the inner wall surface 530W of the third mold body 530 measured under the same conditions was 0.1 µm or less, which was sufficiently low as compared to the surface roughness Ra of the magnetic cover part 300.

—Evaluation Criteria—
A: The surface roughness Ra is 1.6 µm or less.
B: The surface roughness Ra is more than 1.6 µm and 6.3 µm or less.
C: The surface roughness Ra is more than 6.3 µm.

(External Electrode Bonding Property)

The external electrode bonding property was evaluated in conformity with the AEC-Q200 standard. Specifically, the winding wire 210 (external electrode) located on the bottom surface of the small electronic component 10A ($T_{min}$=0.1 mm) used for the evaluation of the moldability was soldered to a copper plate used in place of wiring on a wiring board. Next, a load of 17.7 N (1.8 kg) was continuously applied to the small electronic component 10A fixed to the copper plate from each direction of the direction X and the direction Y of FIG. 1 for 60 seconds. Then, after the completion of the load application test, a peeling state between the external electrode (the winding wire 210) and the flange part 120 of the magnetic core 100 was observed with an optical microscope. The judgment criteria for the evaluation results shown in Table 1 are as described below.

—Evaluation Criteria—
A: No peeling.
C: Partial peeling or complete peeling.

(Withstand Voltage Characteristics)

A disk-shaped evaluation sample (diameter: 12 mm, thickness: 0.7 mm) was produced by using each magnetic material. The heat curing conditions at the time of production of the disk-shaped evaluation sample were the same as in the production of the small electronic component 10A for the evaluation of the moldability. Next, electrodes are mounted on both surfaces of the disk-shaped evaluation sample, and a voltage was applied. In addition, at this time, breakdown electric field strength at which insulation breakdown occurred was measured, and thus the withstand voltage characteristics were evaluated. The judgment criteria for the evaluation results shown in Table 1 are as described below.

—Evaluation Criteria—
A: The breakdown electric field strength is 100 V/mm or more.
B: The breakdown electric field strength is 70 V/mm or more and less than 100 V/mm.
C: The breakdown electric field strength is less than 70 V/mm.

(Antirust Ability)

A block-shaped evaluation sample (length: 4 mm, width: 4 mm, thickness: 2 mm) was produced by using each magnetic material. The heat curing conditions at the time of production of the block-shaped evaluation sample were the same as in the production of the small electronic component 10A for the evaluation of the moldability. Next, the block-shaped evaluation sample was left in a constant-temperature and constant-humidity bath (temperature: 85° C., humidity: 85%), and the presence or absence of the generation of rust after lapse of a predetermined time was visually observed. Thus, the antirust ability was evaluated. The judgment criteria for the evaluation results shown in Table 1 are as described below.

—Evaluation Criteria—
A: No rust is generated after lapse of 500 hours.
B: No rust is generated after lapse of 100 hours.
C: Rust is generated before lapse of 100 hours.

(Coating Film Adhesiveness)

The small electronic component 10A used for the evaluation of the moldability was subjected to dip coating by being immersed in a coating bath filled with a coating liquid (epoxy-based paint), and then subjected to heat treatment at 180° C. Thus, a coating film was formed on the surface of the magnetic cover part 300 of the small electronic component 10A. Next, the small electronic component 10A with the coating film was retained in a constant-temperature and constant-humidity bath (temperature: 85° C., humidity: 85%) for 168 hours, and then left under normal temperature and normal humidity (temperature: about 25° C., humidity: about 50%) for from about 1 hour to about 2 hours, and finally was allowed to pass through a reflow furnace (at 260° C., for 10 seconds) three times. Herein, the coating film adhesiveness was evaluated through visual observation of the sample having passed through the reflow furnace three times. At the time of visual observation, the presence of absence of peeling of the coating film and the area ratio (peeling rate) of a peeling portion in the entire coating area were evaluated. The judgment criteria for the evaluation results shown in Table 1 are as described below.

—Evaluation Criteria—
A: No peeling of the coating film is observed (peeling rate: 0%).
B: Slight peeling of the coating film is observed (peeling rate: more than 0% and about 5% or less).
C: Remarkable peeling of the coating film is observed (peeling rate: more than about 5%).

(Heat Resistance)

A toroidal core-shaped evaluation sample (outer diameter: 15 mm, inner diameter: 10 mm, thickness: 1.5 mm) was produced by using each magnetic material. The heat curing conditions at the time of production of the toroidal core-shaped evaluation sample were the same as in the production of the small electronic component 10A for the evaluation of the moldability. Herein, the heat resistance was evaluated by measuring the magnetic permeability μ of the toroidal core-shaped evaluation sample before and after a heating test, and then calculating the change rate of the magnetic permeability μ after the heating test when the magnetic permeability μ before the heating test was used as a reference value (0%). The judgment criteria for the evaluation results shown in Table 1 are as described below. The heating test was performed on the following two standards: the sample was continuously subjected to heat treatment at 150° C. for 1,000 hours; and the sample was allowed to pass through a reflow furnace (at 260° C., for 5 seconds) five times.

—Evaluation Criteria—
A: The change rate of the magnetic permeability μ is within ±18%.
C: The change rate of the magnetic permeability μ is less than −18% or more than +18%.

(Strength after Heat Curing)

Figure 8:
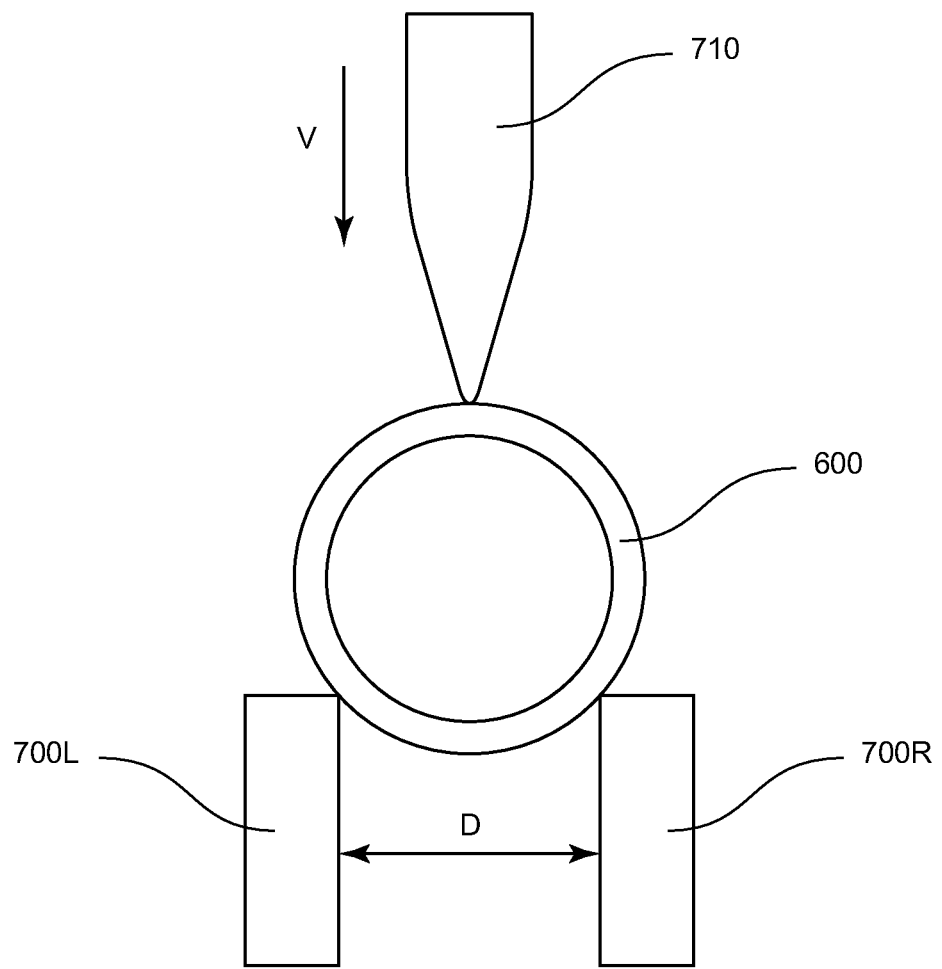
FIG. 8 is a schematic view for illustrating a transverse rupture strength test.

The same toroidal core-shaped evaluation sample as that used for the evaluation of the heat resistance was produced. Next, as illustrated in FIG. 8, a toroidal core-shaped evaluation sample 600 was arranged on two metal support bases 700R and 700L which were arranged at a distance D of 10 mm in a horizontal direction so that the radial direction of the toroidal core-shaped evaluation sample 600 was coincident with a vertical direction. Next, a pin 710 (made of stainless steel, curvature radius R of tip of pin: 0.5 mm) was continuously pressed against the topmost surface of the toroidal core-shaped evaluation sample 600 arranged on the metal support bases 700R and 700L along a downward direction V in the vertical direction at a pressing speed of 5 mm/min. Thus, a transverse rupture strength test was performed. Herein, the strength after heat curing was evaluated by measuring fracture strength in the transverse rupture strength test. The judgment criteria for the evaluation results shown in Table 1 are as described below.

—Evaluation Criteria—
A: The fracture strength is 10 N or more.
B: The fracture strength is 1 N or more and less than 10 N.
C: The fracture strength is less than 1 N.

TABLE 1

| | Composition of magnetic material (mass %) | | | Evaluation result | | | | | | | | |
|---|---|---|---|---|---|---|---|---|---|---|---|---|
| | Addition | | | | | | | | | Heat resistance | | |
| | Addition amount D of dispersant | Addition amount M of magnetic powder | Addition amount R of resin | Mold-ability | Magnetic powder escape prevention ability | External electrode bonding property | Withstand voltage characteristics | Antirust ability | Coating film adhe-siveness | Continuous heating at 150° C. | Reflow furnace at 260° C. | Strength after heat curing |
| Comparative Example 1 | 0.0 | 93.0 | 7.0 | C | C | C | C | C | C | A | A | A |
| Example 1 | 0.1 | 93.0 | 6.9 | A | A | A | B | A | A | A | A | A |
| Example 2 | 0.1 | 90.9 | 9.0 | A | A | A | A | A | A | A | A | A |
| Example 3 | 0.1 | 92.9 | 7.0 | A | A | A | B | A | A | A | A | A |
| Example 4 | 0.1 | 94.9 | 5.0 | B | A | A | B | A | A | A | A | A |
| Example 5 | 0.1 | 95.9 | 4.0 | B | A | A | B | A | A | A | A | A |
| Example 6 | 0.2 | 93.0 | 6.8 | A | A | A | A | A | A | A | A | A |
| Example 7 | 0.5 | 93.0 | 6.5 | A | A | A | A | A | A | A | A | A |
| Example 8 | 1.0 | 93.0 | 6.0 | A | A | A | A | A | A | A | A | A |
| Example 9 | 2.0 | 93.0 | 5.0 | A | A | A | A | A | A | A | A | B |
| Example 10 | 3.0 | 93.0 | 4.0 | A | A | A | B | A | A | A | A | B |
| Example 11 | 3.0 | 91.0 | 6.0 | A | A | A | A | A | A | A | A | A |
| Example 12 | 3.0 | 92.0 | 5.0 | A | A | A | A | A | A | A | A | B |

Even when the kind of the phosphoric acid ester-based surfactant or the kind of the epoxy resin was changed in Examples 1 to 12, almost the same results as those in Examples 1 to 12 were obtained. However, when the phosphoric acid ester-based surfactant was replaced with a dispersant other than the phosphoric acid ester-based surfactant (for example, polycarboxylic acid-based dispersant or the like) in Examples 1 to 12, any one or more of the following characteristics were insufficient (evaluation C): the moldability, the magnetic powder escape prevention ability, the external electrode bonding property, the withstand voltage characteristics, the antirust ability, the coating film adhesiveness, the heat resistance, and the strength after heat curing. All of the above-mentioned characteristics were not able to be satisfied at the same time.

What is claimed is:
1. A small electronic component, comprising:
a magnetic core comprising at least a columnar core part;
a winding coil arranged so as to surround an outer peripheral surface side of the columnar core part and formed by winding a winding wire; and
a magnetic cover part formed so as to cover at least part of the magnetic core and the winding coil while following at least part of shapes of the magnetic core and the winding coil through use of a magnetic material containing a mixture of a phosphoric acid ester-based surfactant, magnetic powder, and a resin, wherein the magnetic material satisfies the following expressions (1) and (2A) to (5A):

$$D+M+R=100 \quad \text{Expression (1)}$$

$$M \geq 90.5 \quad \text{Expression (2A)}$$

$$R \geq 3.5 \quad \text{Expression (3A)}$$

$$R \leq -M+99.95 \quad \text{Expression (4A)}$$

$$R \geq -M+96.5 \quad \text{Expression (5A)}$$

where D represents the content (mass %) of the phosphoric acid ester-based surfactant in the magnetic material, M represents the content (mass %) of the magnetic powder in the magnetic material, and R represents the content (mass %) of the resin in the magnetic material.

2. A small electronic component according to claim 1, wherein the magnetic cover part has a minimum thickness of 0.8 mm or less.

3. A small electronic component according to claim 1, wherein the magnetic cover part has a minimum thickness of 0.5 mm or less.

4. A small electronic component according to claim 1, wherein a surface of the magnetic cover part has a surface roughness Ra of 6.3 μm or less.

5. A small electronic component according to claim 1, wherein a surface of the magnetic cover part has a surface roughness Ra of 1.6 μm or less.

6. A small electronic component according to claim 1, wherein the magnetic cover part is molded so as to cover the entire winding coil and part of the magnetic core including the columnar core part while following a shape of the entire winding coil and a shape of part of the magnetic core.

7. A small electronic component according to claim 1, wherein the magnetic core comprises the columnar core part and a flange part extending in a direction orthogonal to an axial direction of the columnar core part.

8. A small electronic component according to claim 1, wherein the phosphoric acid-ester-based surfactant is selected from a group consisting of a polyoxyethylene alkyl ether phosphoric acid ester, a salt of the polyoxyethylene alkyl ether phosphoric acid ester, and an alkyl phosphate.

9. A small electronic component according to claim 1, comprising an electronic component for surface mounting selected from the group consisting of an inductor, a transformer and a filter.

10. An electronic circuit board, comprising at least a wiring board having wiring patterned thereon and a small electronic component, wherein the small electronic component comprises:
a magnetic core comprising at least a columnar core part;
a winding coil arranged so as to surround an outer peripheral surface side of the columnar core part and formed by winding a winding wire; and
a magnetic cover part formed so as to cover at least part of the magnetic core and the winding coil while following at least part of shapes of the magnetic core and the winding coil through use of a magnetic material containing a mixture of a phosphoric acid ester-based surfactant, magnetic powder, and a resin, wherein the magnetic material satisfies the following expressions (1) and (2A) to (5A):

$$D+M+R=100 \quad \text{Expression (1)}$$

$$M \geq 90.5 \quad \text{Expression (2A)}$$

$$R \geq 3.5 \quad \text{Expression (3A)}$$

$$R \leq -M+99.95 \quad \text{Expression (4A)}$$

$$R \geq -M+96.5 \quad \text{Expression (5A)}$$

where D represents the content (mass %) of the phosphoric acid ester-based surfactant in the magnetic material, M represents the content (mass %) of the magnetic powder in the magnetic material, and R represents the content (mass %) of the resin in the magnetic material.

11. An electronic circuit board according to claim 10, wherein the wiring further has another electronic component connected thereto.

* * * * *